(12) United States Patent
Bianchini et al.

(10) Patent No.: US 6,875,056 B1
(45) Date of Patent: Apr. 5, 2005

(54) FIBER OPTIC TRANSCEIVER PACKAGE WITH INTEGRAL EMI GASKET

(75) Inventors: Gioni Bianchini, Sunol, CA (US); Iggoni Fajardo, Sunol, CA (US)

(73) Assignee: Fourte Design & Development, LLC, Sunol, CA (US)

( * ) Notice: Subject to any disclaimer, the term of this patent is extended or adjusted under 35 U.S.C. 154(b) by 0 days.

(21) Appl. No.: 10/668,793

(22) Filed: Sep. 22, 2003

Related U.S. Application Data

(63) Continuation-in-part of application No. 10/402,751, filed on Mar. 28, 2003, now Pat. No. 6,764,318.

(51) Int. Cl.[7] .............................................. H01R 13/648
(52) U.S. Cl. ......................... 439/608; 439/82; 439/108; 439/541.5; 439/567
(58) Field of Search ................................ 439/108, 567, 439/608–610, 541.5, 939, 82–83

(56) References Cited

U.S. PATENT DOCUMENTS

| | | | |
|---|---|---|---|
| 6,196,870 B1 * | 3/2001 | Wu ............................. | 439/567 |
| 6,206,730 B1 * | 3/2001 | Avery et al. ................. | 439/609 |
| 6,364,709 B1 * | 4/2002 | Jones ........................... | 439/607 |
| 6,416,361 B1 * | 7/2002 | Hwang ......................... | 439/607 |
| 6,443,768 B1 * | 9/2002 | Dirkers et al. ............... | 439/607 |
| 6,459,517 B1 * | 10/2002 | Duncan et al. .............. | 398/135 |
| 6,485,328 B1 * | 11/2002 | Wu ............................. | 439/567 |
| 6,508,670 B1 * | 1/2003 | Hwang ......................... | 439/607 |
| 6,599,136 B2 * | 7/2003 | Sheldon et al. ................ | 439/92 |
| 6,612,868 B2 * | 9/2003 | Hwang ......................... | 439/607 |
| 6,661,565 B2 * | 12/2003 | Shaw et al. .................. | 359/297 |

* cited by examiner

*Primary Examiner*—Truc Nguyen
(74) *Attorney, Agent, or Firm*—The Kline Law Firm

(57) ABSTRACT

A package for a fiber optic transceiver that integrates the intermediate rear gasket into the lower body of the transceiver package. As such, the EMI fingers are much thicker than current art EMI fingers, 0.010" thick as compared to current art 0.002" thick. In current art devices, providing such robust EMI fingers is not possible. The connecting pins that secure the transceiver cage to the PCB are self-centering press-fit pins formed from a plurality of legs. At least one of the legs provides an electrical connection point for the transceiver on which the pins are used. The connecting pin is formed so that the legs act as leaf springs to securely hold the connector in place in the proper installation hole in the board on which the transceiver is installed. The pins are stamped from sheet metal with a progressive die process. By changing the amount of flexion in the legs of the pin, the pressure required to insert the pin into a connection hole, and hence the retaining pressure, can be varied.

6 Claims, 4 Drawing Sheets

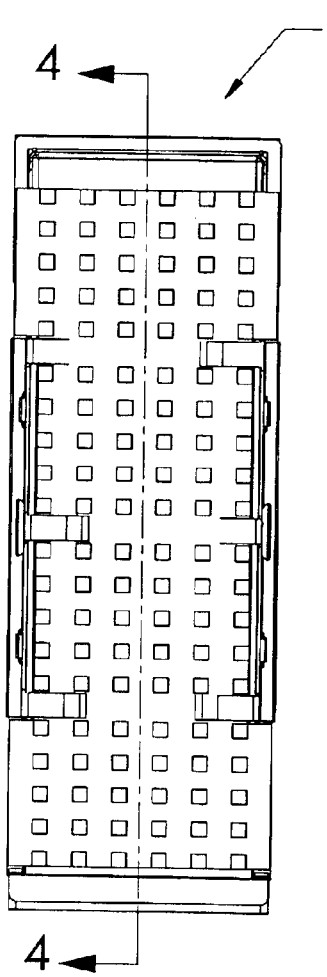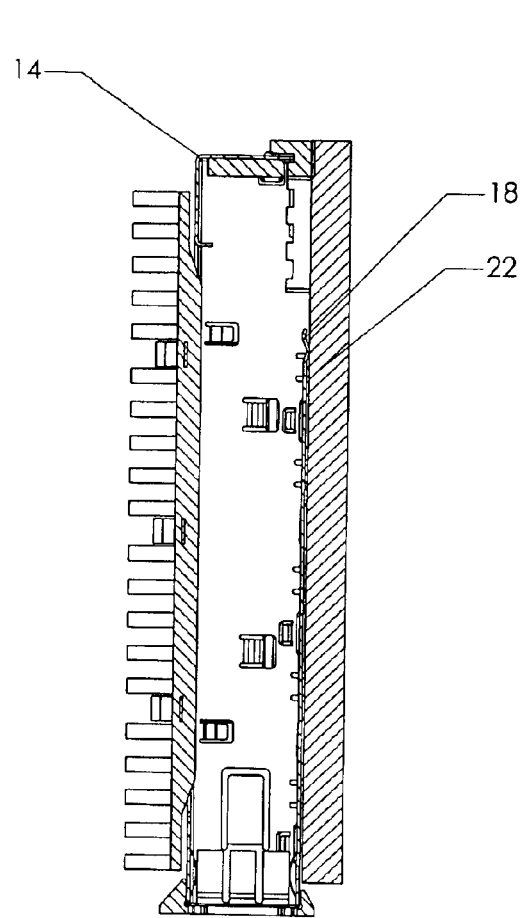
Fig. 3
Fig. 4

FIBER OPTIC TRANSCEIVER PACKAGE WITH INTEGRAL EMI GASKET

This application is a continuation-in-part of application Ser. No. 10/402,751, filed Mar. 28, 2003 now U.S. Pat. No. 6,764,318.

BACKGROUND OF THE INVENTION

1. Field of the Invention

The present invention relates generally to fiber optic electronic components, and more particularly is a fiber optic transceiver package.

2. Description of the Prior Art

Computers and related peripheral equipment, and satellite and communication systems, have in the recent past evolved extremely rapidly. These systems require ever increasing data transfer rates to perform the highly complex tasks that drive the systems, such as digital signal processing, image analysis, and communications. With current demands, optical couplers are used to transfer signals over short and long distances between computers, between two circuit boards in one computer, and even between multiple chips on a single printed circuit board. The use of high speed optical signals in place of electrical interconnections increases the achievable data transfer rate.

An optical transmitter/receiver module typically includes both light emitting devices such as vertical cavity surface emitting lasers (VCSEL's) and light detecting devices such as photodiodes. Driver/receiver circuitry modules, typically in the form of application specific integrated circuit (ASIC) chips, include driver circuitry which receives electrical signals from one device and drives the VCSEL's in response. The ASIC also includes receiver circuitry for receiving signals from the photodiodes and, in response, for processing those signals into an appropriate output. The combination of the VCSEL's, the photodiodes, and the ASIC circuitry is commonly referred to as an optical transceiver or a fiber optic transceiver.

To provide heat dissipation means and EMI (electro-magnetic interference) protection for the circuitry of the transceivers, the transceivers are enclosed in packages. The main subject of this invention is the XFP (10 gigabit small form factor pluggable module) package that includes, per MSA (Multi Source Agreement) standards, a set of EMI dissipation fingers. The subject fingers are referred to as the intermediate rear EMI gasket in XFP MSA 2003, drawing FIG. 40. The gasket presents an additional component that must be assembled when constructing the package. In addition to the time and expense represented by this assembly process, the junction of the gasket with the main body of the transceiver cage represents an area of potential mechanical failure.

Accordingly, it is a main object of the present invention to provide an improved package for an optic transceiver that integrates the intermediate rear EMI gasket into the main body of the fiber optic transceiver package.

SUMMARY OF THE INVENTION

The present invention is a package for a fiber optic transceiver. The package integrates the intermediate rear gasket into the lower body of the transceiver package. The metallic EMI fingers of the intermediate rear gasket are simply extensions of the metallic transceiver cage. As such, the EMI fingers of the present invention are much thicker than current art EMI fingers. Standard EMI fingers are approximately 0.002" thick. The integral EMI fingers of the present invention are 0.010" thick. In current art devices, providing such robust EMI fingers is not possible. If substantial EMI fingers are utilized with current art connecting mechanisms, the contact of the fingers with a transceiver inserted into the package on the PCB displaces the components of the transceiver relative to the PCB, thereby compromising the electrical contacts of the components of the transceiver.

To solve this problem, the present invention utilizes a design proprietary (patent pending) to the assignee herein for the connecting pins that secure the transceiver cage to the PCB. The connecting pins are self-centering press-fit pins formed from a plurality of legs. At least one of the legs provides an electrical connection point for the transceiver on which the pins are used. The connecting pin is formed so that the legs act as leaf springs to securely hold the connector in place in the proper installation hole in the board on which the transceiver is installed. The pins are stamped from sheet metal with a progressive die process. By changing the amount of flexion in the legs of the pin, the pressure required to insert the pin into a connection hole, and hence the retaining pressure, can be varied.

An advantage of the present invention is that forming the EMI fingers constituting the intermediate rear gasket as integral members of the transceiver cage eliminates a component of the transceiver package, thereby reducing assembly time and cost.

Another advantage of the present invention is that the use of the thicker cage sheeting material to form the fingers of intermediate rear gasket reduces significantly the possibility of mechanical failure.

These and other objects and advantages of the present invention will become apparent to those skilled in the art in view of the description of the best presently known mode of carrying out the invention as described herein and as illustrated in the drawings.

BRIEF DESCRIPTION OF THE DRAWINGS

FIG. 3 is a top view of the transceiver package.

FIG. 4 sectional view taken along line 4—4 in FIG. 3.

DETAILED DESCRIPTION OF THE INVENTION

Figure 1:
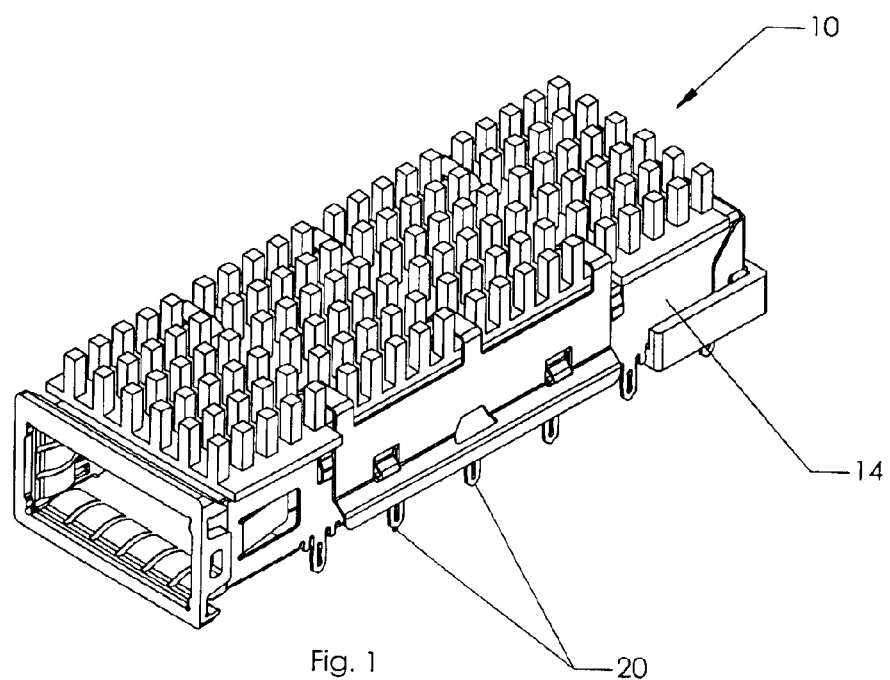
FIG. 1 is a top perspective view of an XFP fiber optic transceiver package constructed according to the present invention.
Figure 2:
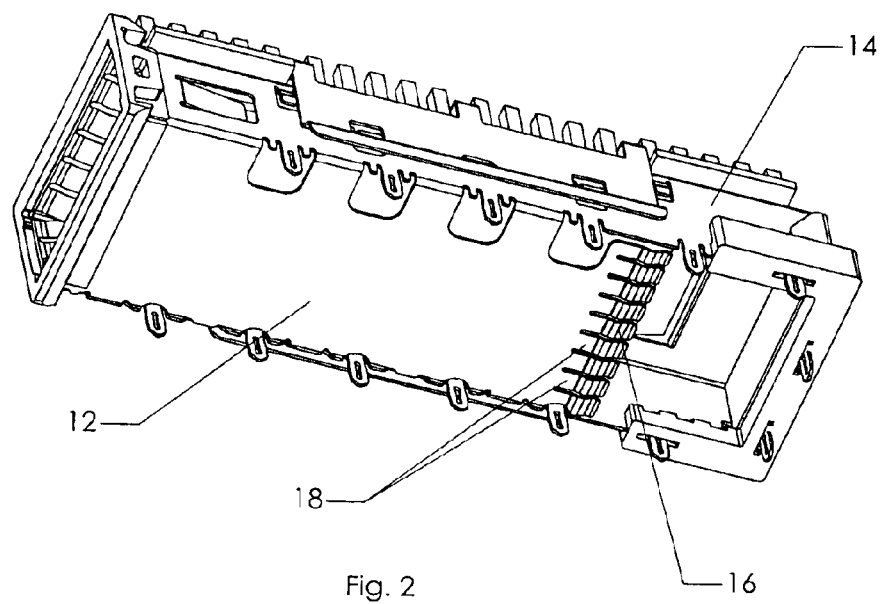
FIG. 2 is a bottom perspective view of the transceiver package.
Figure 5:
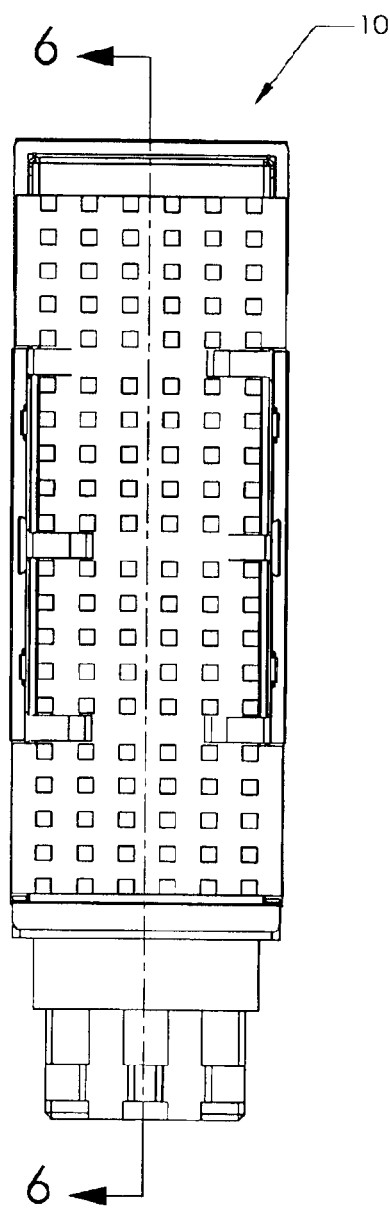
FIG. 5 is a top view of the transceiver package with a transceiver module inserted.
Figure 6:
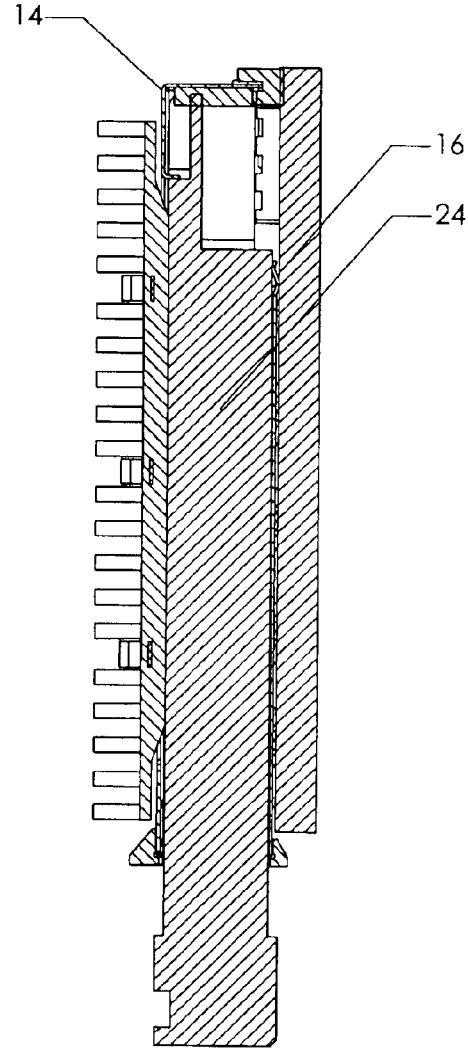
FIG. 6 sectional view taken along line 6—6 in FIG. 5.

The present invention is a fiber optic transceiver package 10. The package 10 is standard many respects, but differs from the prior art significantly in the construction of the lower half 12 of the transceiver cage 14. The transceiver package 10 of the present invention integrates the intermediate rear gasket called out by the MSA specifications into the body of the transceiver package 10.

The intermediate rear gasket 16 of the present invention is comprised of a plurality of EMI fingers 18. In the preferred embodiment, the metallic fingers 18 of the intermediate rear gasket 16 are simply extensions of the lower half 12 of the metallic transceiver cage 14. As such, the EMI fingers 18 of the present invention are much thicker than current art EMI fingers. Standard EMI fingers are approximately 0.002" thick. The integral EMI fingers 18 forming the intermediate rear gasket 16 of the present invention are 0.010" thick.

Because of the far more rigid fingers 18, the connecting pins 20 that affix the transceiver cage 14 to a PCB 22 must hold the cage 10 in place far more securely than standard pins when the transceiver module 24 is inserted. The connecting pins 20 of the present invention are self-centering press-fit pins formed from a plurality of legs 201. At least one of the legs 201 is used as an electrical connection point for the optical transceiver 10. The connecting pin 20 is formed so that the legs 201 act as leaf springs to securely hold the cage 14 in place in the board 22 on which the transceiver 10 is installed. The pins 20 are stamped from sheet metal with a progressive die stamping process. By changing the amount of flexion in the legs 201 of the pin 20, the pressure required to insert the pin 20 into a connection hole, and hence the retaining pressure of the pin 20, can be varied.

Figure 7:
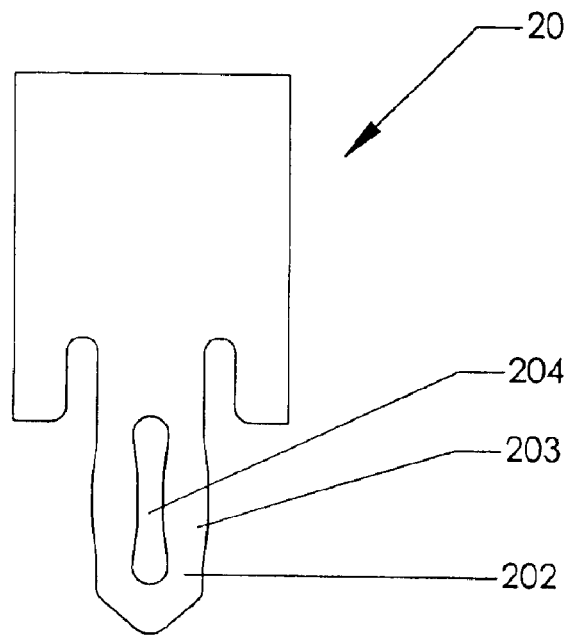
FIG. 7 shows the connector pin of the present invention prior to forming.
Figure 8:
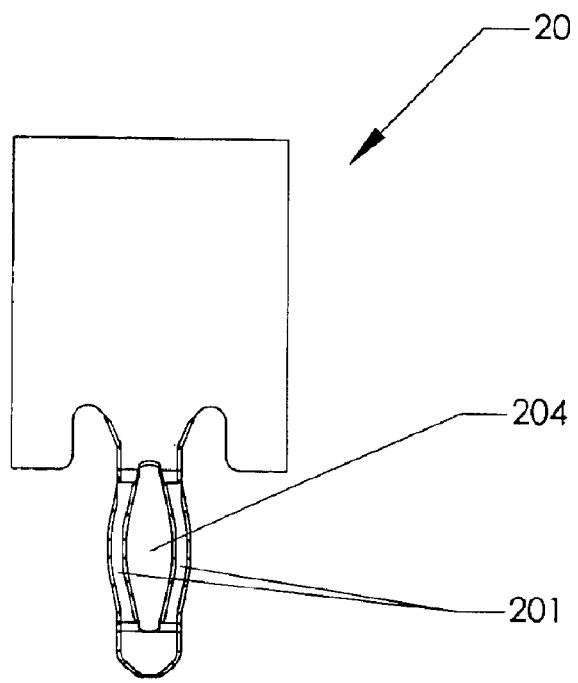
FIG. 8 shows the connector pin of FIG. 7 following forming.

Referring now to FIGS. 7 and 8, in the preferred embodiment the connector pin 20 of the present invention is formed by successive stamping. The flat blank that is shown in FIG. 7 is formed into the partially open cylindrical shape illustrated in FIG. 8. The blank includes a pin extension 202 with a curved and widened middle section 203 and a central opening 204.

Following forming, the pin 20 is in the conformation shown in FIG. 8. The central opening 204 is expanded during forming. The middle section 203 is formed into the arced legs 201, each leg 201 being a curved projection with a circular cross section, the cross section varying from end to end, with a maximum at a midpoint. The curved middle section 203 provides a large contact area for connection with whatever component is being used with the pin 20. The central opening 204 allows the formation of the middle section 203 into the legs 201 which serve as connection posts that flex when the pin 20 is inserted into the PCB 22. The flexing of the legs 201 is what ensures a secure connection of the transceiver package 10, or any other electronic component utilizing the connector pin 20, to the PCB 22. Each leg 201 acts as a spring urging the other leg 201 into a secure contact position with the surface of the PCB 22. As indicated above, the holding power of the legs 201 in the PCB 22 can be varied by adjusting the curvature of the legs 201.

In the preferred embodiment, the connector pin 20 is formed integrally to the transceiver cage 14, or any other electronic component utilizing the connector pin 20. It should be recognized by those skilled in the art that the connector pin 10 can also be readily manufactured as an independent element, and later attached to the cage 14, by any of several applicable known means, such as soldering, welding, or insert molding.

The magnitude of the flexion force of the legs 201 of the pin 20 can be easily and accurately controlled by varying the amount of arc placed in the leg 201 during the manufacturing process. The amount of force required to insert and to remove the connector pin 20 from the PCB 22 can therefore be similarly controlled. By maintaining the flexion force within non-destructive operating bounds, the connector pin 20 can be used repeatedly without significant degradation in securing capability. The flexion force created by the legs 201 also makes the connector pin 20 a self-centering element.

The above disclosure is not intended as limiting. Those skilled in the art will readily observe that numerous modifications and alterations of the device may be made while retaining the teachings of the invention. Accordingly, the above disclosure should be construed as limited only by the restrictions of the appended claims.

We claim:

1. A fiber optic transceiver package comprising:

a main transceiver cage, a lower portion of said cage comprising an intermediate rear EMI gasket, said intermediate rear EMI gasket being an integral component of said transceiver cage so that no attaching operation is required to affix said intermediate rear EMI gasket to said transceiver cage, said intermediate rear EMI gasket being formed by at least one upward protruding finger that shields an interior of said transceiver cage;

wherein said transceiver cage comprises a connecting pin adapted to secure said transceiver cage to a PCB, said connecting pin comprising;

more than one leg; and a terminal section; wherein said legs are arced outward from a first end of said connector pin relative to a central longitudinal axis of said connector pin toward a midpoint of said connector pin, a diameter of said connector pin being at a maximum at said midpoint, said legs then arcing inward toward a common terminal section so that said legs are bowed symmetrically about said longitudinal axis, a tension generated by said bowing of said legs causing said legs to act as a leaf spring when said connector pin is inserted into one of the receiving holes of the receiving element, said legs being slightly compressed as said midpoint enters the receiving hole to create a flexion force, said flexion force ensuring a tight contact point between each of said legs and a surface of the receiving hole in the receiving element; and each said leg is arced about a longitudinal axis, so that outer surfaces of said legs lie on arcs of a circle.

2. The fiber optic transceiver package as defined in claim 1 wherein:

said protruding finger has a thickness of at least 0.005 inches.

3. The fiber optic transceiver package as defined in claim 1 wherein:

said intermediate rear EMI gasket if formed from a plurality of protruding fingers.

4. The fiber optic transceiver package as defined in claim 3 wherein:

each said protruding finger has a thickness of at least 0.005 inches.

5. The fiber optic transceiver package as defined in claim 1 wherein:

a magnitude of said flexion force is varied by varying an amount of at-rest arc placed in said legs during manufacturing.

6. The fiber optic transceiver package as defined in claim 1 wherein:

said connector pin is formed as an integral portion of said cage.

* * * * *